United States Patent [19]

Sunouchi

[11] Patent Number: 4,897,702
[45] Date of Patent: Jan. 30, 1990

[54] SEMICONDUCTOR MEMORY DEVICE AND MANUFACTURING METHOD FOR THE SAME

[75] Inventor: Kazumasa Sunouchi, Yokohama, Japan

[73] Assignee: Kabushiki Kaisha Toshiba, Kawasaki, Japan

[21] Appl. No.: 159,597

[22] Filed: Feb. 24, 1988

[30] Foreign Application Priority Data

Feb. 24, 1987 [JP] Japan .................................. 62-39022

[51] Int. Cl.$^4$ ..................... H01L 29/78; H01L 29/06; H01L 29/02
[52] U.S. Cl. ..................................... 357/23.6; 357/55; 357/41
[58] Field of Search .................... 357/23.6, 55; 437/52

[56] References Cited

U.S. PATENT DOCUMENTS 4,643,804  2/1987  Lynch et al. .......................... 204/15

FOREIGN PATENT DOCUMENTS

| 58-212161 | 12/1983 | Japan . | |
|---|---|---|---|
| 012752 | 1/1985 | Japan | 437/52 |
| 156859 | 7/1986 | Japan | 437/52 |
| 234067 | 10/1986 | Japan | 357/23.6 |
| 240672 | 10/1986 | Japan | 437/52 |

OTHER PUBLICATIONS

Technical Digest of IEDM, "A High Density 4M DRAM Process Using Folded Bitline Adaptive Side-Wall Isolated Capacitor (FASIC) Cell", M. Nagatomo et al.; 1986, pp. 144–147.

Primary Examiner—Rolf Hille
Assistant Examiner—Robert P. Limanek
Attorney, Agent, or Firm—Oblon, Spivak, McClelland, Maier & Neustadt

[57] ABSTRACT

An isolated region in which a MOS transistor and a capacitor are formed is surrounded by a groove. The groove includes first and second region grooves. A first insulating layer which separates the isolated region is provided on the inner surface of a predetermined lower portion of the first region groove and on the inner surface of the second region groove. A second insulating layer is provided on the inner surface of the remaining upper portion of the first region groove. The first insulating layer is thinner than half the width of the groove and thicker than the first insulating layer. A capacitor electrode is embedded in the first and second region grooves.

3 Claims, 5 Drawing Sheets

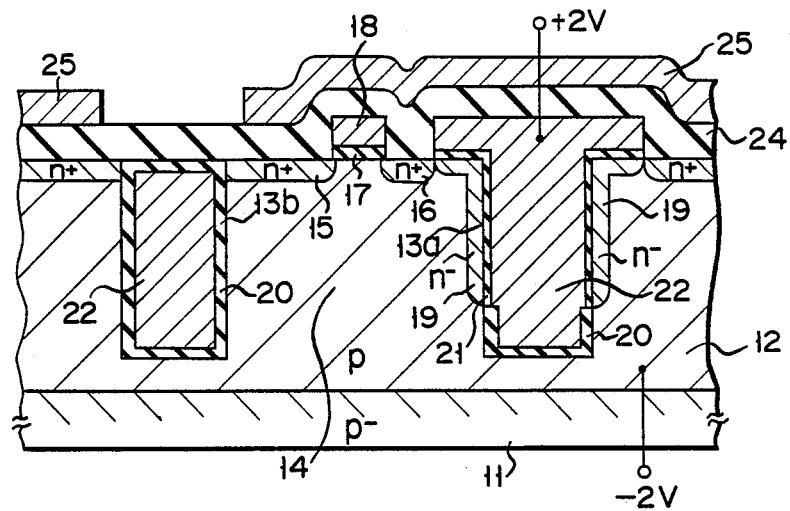
F I G. 3
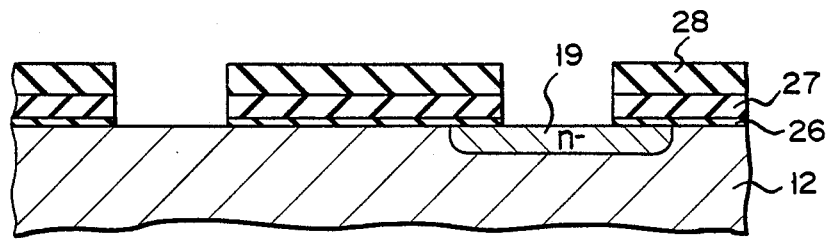
F I G. 4A
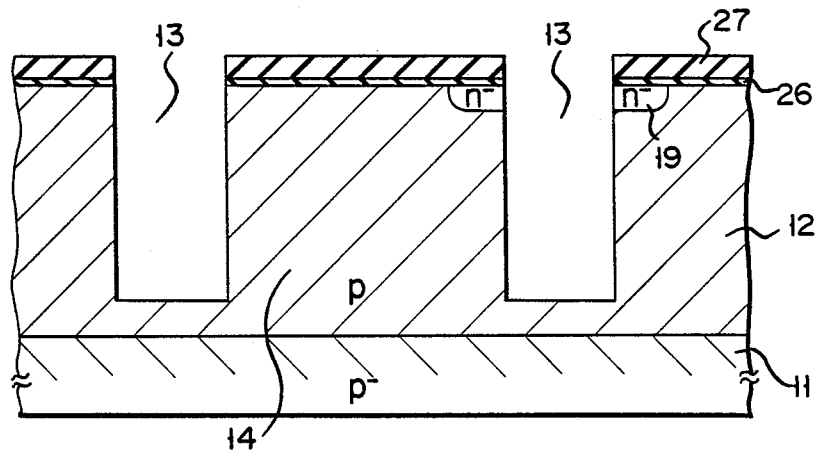
F I G. 4B

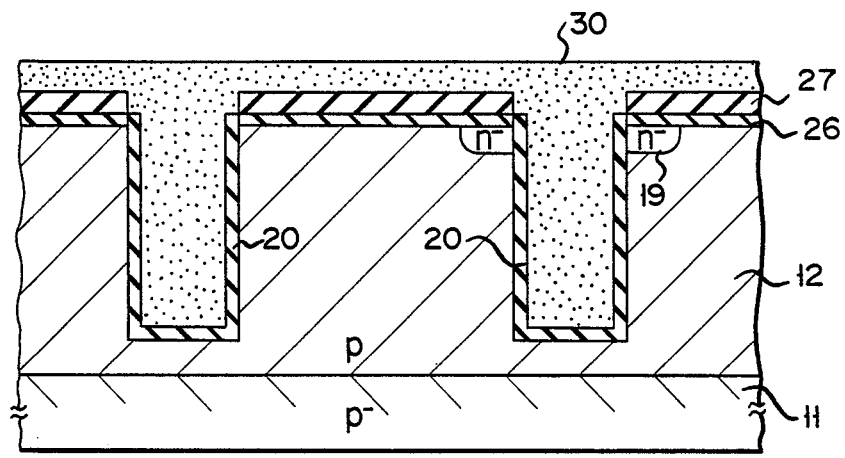
F I G. 4C
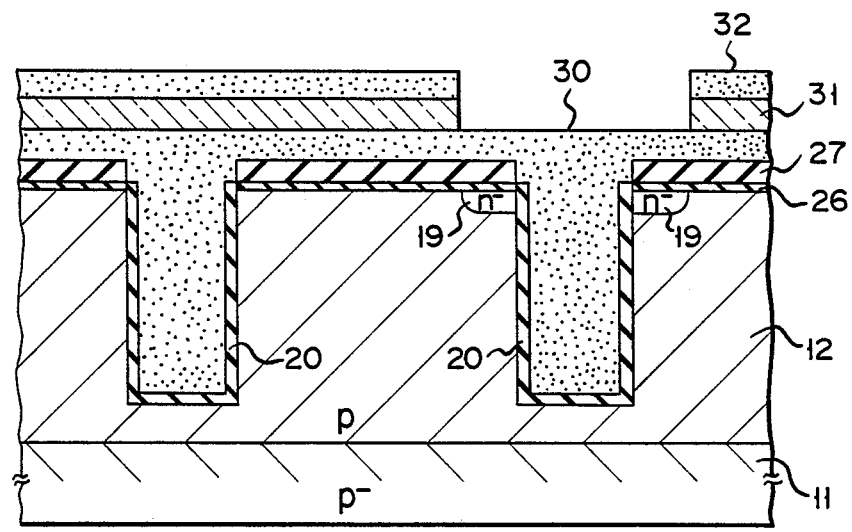
F I G. 4D

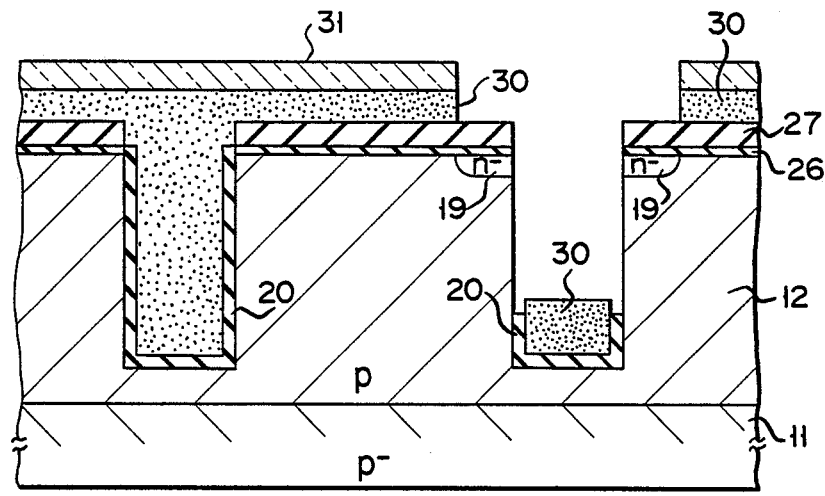
F I G. 4E
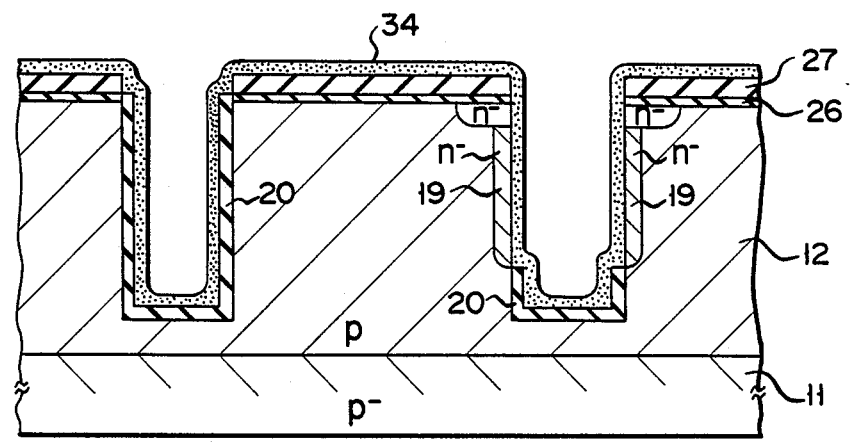
F I G. 4F

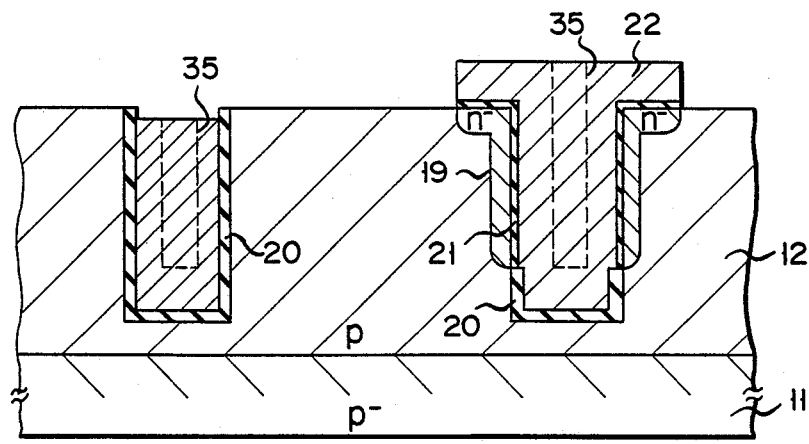
F I G. 4G
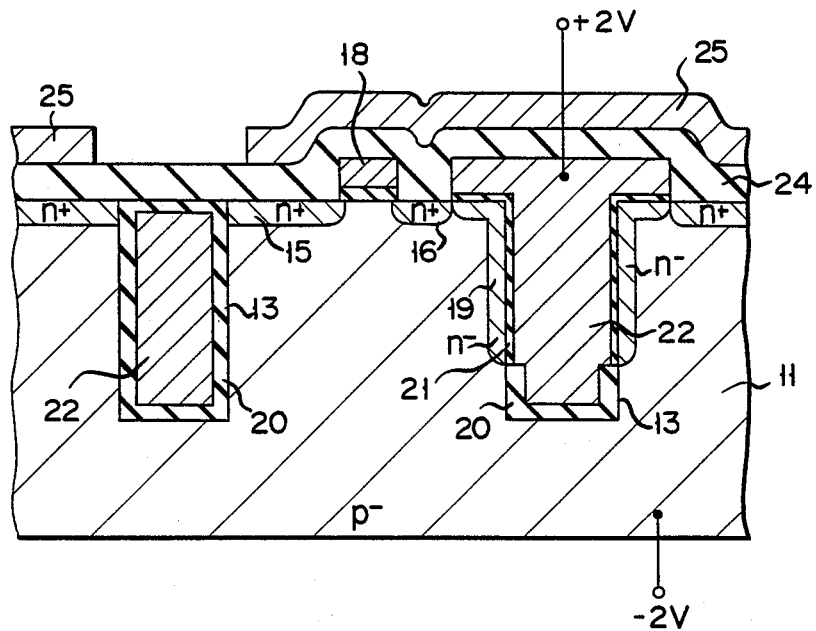
F I G. 5

SEMICONDUCTOR MEMORY DEVICE AND MANUFACTURING METHOD FOR THE SAME

BACKGROUND OF THE INVENTION

1. Field of the Invention

This invention relates to a semiconductor memory device having memory cells each formed of a MOS transistor and a capacitor, and a manufacturing method for the semiconductor memory device.

2. Description of the related art including information disclosed under §§1.97-1.99:

With recent MOS type DRAMs (Dynamic Random Access Memories) a great number of unit memory cells are integrated on a chip. Each unit memory cell is formed of a MOS transistor and a capacitor connected in series with the transistor. To increase the number of the unit memory cells to be integrated on a chip, it is desired that the area occupied by each memory cell be reduced. However, the reduction in the area occupied by the memory cell will lead to reduction in the capacitance of the capacitor, thus lowering the reliability of the DRAM. For this reason various structures of the unit memory cell have heretofore been developed in order to reduce the area occupied by the unit memory cell without decreasing the capacitance of the capacitor.

A typical example of such unit memory cell structures is shown in FIG. 1. This unit memory cell is well known as FCC (Folded Capacitor Cell) structure.

In FIG. 1, a groove 2 is formed in a semiconductor substrate 1. In a memory cell forming region 3 surrounded by groove 2, a MOS transistor is formed which has a source region, a drain region, a gate insulating layer 4, and a gate electrode 5. Groove 2 is comprised of a first region groove and a second region groove. In the first region groove are formed a first oxide layer 5 adapted for electrically isolating memory cell forming region 3, and a second oxide layer 6 adapted for forming a capacitor. Second oxide layer 6 is formed to cover a region 7 of an opposite conductivity type to substrate 1. Further, a capacitor electrode 8 is formed in the first region groove to contact second oxide layer 6. First oxide layer 5 also is formed in the second region groove as shown.

The above-mentioned structure of the unit memory cell has the following drawbacks.

Since first oxide layer 5 of the same thickness as the width of groove 2 is embedded in the lower portion of the first region groove and in the second region groove, crystal defects will be caused in substrate 1 by stress resulting from a difference between thermal expansion coefficients of substrate 1 and oxide layer 5. Further, during an etching process required to leave first oxide layer 5 in the bottom portion of the first region groove only, the width of the upper portion of the first region groove will broaden. It is difficult, therefore, to leave first oxide layer 5 in the lower portion of the first region groove.

The crystal defects increase junction leaks, and the broadening of the groove width decreases the capacitor area, thus degrading the performance of the DRAM.

SUMMARY OF THE INVENTION

It is an object of the invention to provide a folded capacitor cell capable of preventing the generation of crystal defects in a substrate, and suppressing the broadening of the width of a groove.

It is another object of the invention to provide a manufacturing method of a folded capacitor cell capable of preventing the generation of crystal defects in a substrate, and suppressing the broadening of the width of a groove.

A semiconductor memory device according to this invention comprises groove means formed in a semiconductor substrate for separating one memory cell forming region from another memory cell forming region, the memory cell comprising a MOS transistor formed in the memory cell forming region and a capacitor connected in series to the MOS transistor. The groove means is composed of a first groove in which a first insulating layer for separating the memory cell forming region and a second insulating layer for forming the capacitor, and a second groove in which the first insulating layer is formed. The first insulating layer has a thickness smaller than half the width of the groove, and the second insulating layer has a thickness smaller than that of the first insulating layer. The first insulating layer in the first groove is provided on the inner surface of a predetermined lower portion of the first groove, and the second insulating layer is provided on the inner surface of the remaining upper portion of the first groove. A capacitor electrode is provided in the first groove through the first and second insulating layers and in the second groove through the first insulating layer.

A manufacturing method according to this invention relates to a semiconductor memory device which comprises a groove formed in a semiconductor substrate for electrically separating one memory cell forming region from another memory cell forming region, the memory cell comprising a MOS transistor formed in the memory cell forming region, and a capacitor connected in series to the MOS transistor. The groove includes a first region groove in which the capacitor is formed and a second region groove for the electrical separation.

The manufacturing method comprises the steps of forming the groove, forming a first insulating layer on the entire inner surface of the groove; selectively etching the first insulating layer provided on the inner surface of a predetermined upper portion of the first region groove for exposing the inner surface; forming a second insulating layer on the exposed inner surface of the first region groove for forming the capacitor, the first insulating layer being thicker than the second insulating layer and thinner than half of the width of the groove; and filling a capacitor electrode into the first region groove through the first and second insulating layers and into the second region groove through the first insulating layer.

BRIEF DESCRIPTION OF THE DRAWINGS

FIG. 3 is a cross sectional view taken along a line A—A of FIG. 2;

FIGS. 4A through 4G are cross sectional views useful in explaining manufacturing processes of the memory device shown in FIG. 3; and FIG. 5 is a cross sectional view of a memory device according to another embodiment of this invention.

DETAILED DESCRIPTION OF THE PREFERRED EMBODIMENT

Figure 2:
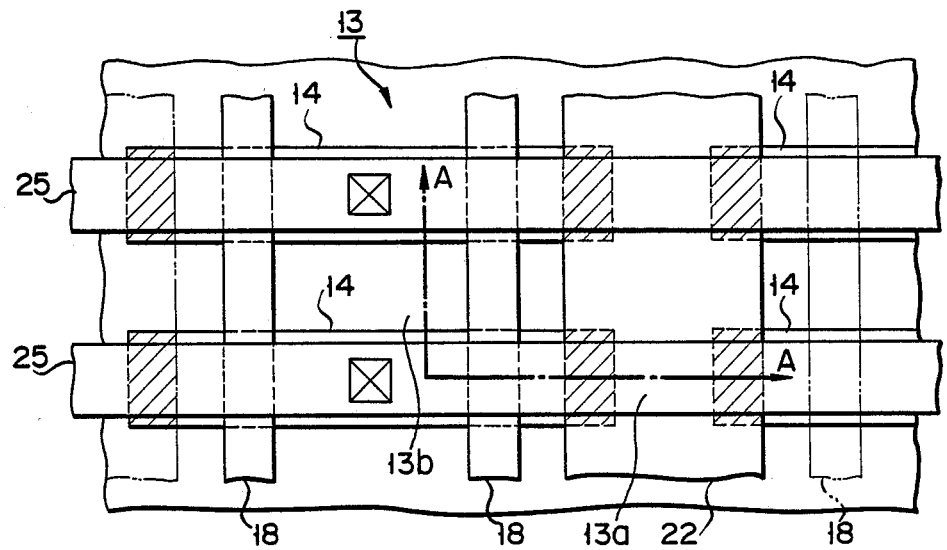
FIG. 2 is a top view of a semiconductor memory device according to an embodiment of this invention.

FIGS. 2 and 3 show an embodiment in which a unit memory cell is fabricated by a MOS transistor and a capacitor. As shown in FIG. 3, a P type well 12 is formed on a P$^-$ type Si substrate 11. A memory cell forming region or island-like region 14 surrounded by a groove 13 is formed in P type well 12. Further, island-like region 14, a MOS transistor which includes N$^+$ type regions 15 and 16; a gate insulating layer 17; and a gate electrode 18, and an N$^-$ type region 19 connected to N$^+$ type region 16, are formed in island-like region 14.

Groove 13 includes a first region groove 13a and a second region groove 13b. A first insulating layer 20 whose thickness preferably ranges from 500 to 1,000 Å is formed in the inner surface of a predetermined lower portion of the first region groove. A second insulating layer 21 of a thickness of about 100 Å is formed on the inner surface of the remaining upper portion of the first region groove 3a and both ends of each island-like region 14. That is, second insulating layer 21 is respectively formed on a part of upper surface and three side walls of each end of the island-like region 14, namely, between capacitor electrode 22 and island-like region 14. The regions in which second insulating layer 21 are formed are shown by shaded regions in FIG. 2. Second insulating layer 21 is formed to be in contact with N$^-$ type region 19. It should be noted that the thickness of first insulating layer 20 is less than half the width of groove 13. First insulating layer 20 is formed, as shown in FIG. 3, to a predetermined height above the bottom of groove 13. First insulating layer 20 is also formed on the inner surface of the second region groove. A capacitor electrode 22 (preferably made of polysilicon) is embedded in the first region groove along first and second insulating layers 20 and 21. Capacitor electrode 22 is also embedded in the second region groove along first insulating layer 20.

An inter-insulating layer 24 is formed over the MOS transistor and capacitor electrode 22. A bit line 25 made of aluminum is formed on inter-insulating layer 24. The impurity concentration of substrate 11 is $2 \times 10^{15}$ cm$^{-3}$, and the impurity concentration of P type well 12 is $1 \times 10^{17}$ cm$^{-3}$. Capacitor electrode 22 is connected to a power source $+2$ V, and P type well 12 is connected to a power source $-2$ V.

With reference to FIGS. 4A through 4G, the method for fabricating the semiconductor memory device shown in FIG. 3 will be described.

As show in FIG. 4A, on the entire upper surface of P type well 12, located over P$^-$ Si substrate 11, are sequentially formed SiO$_2$ layer 26, SiN layer 27, and CVD-SiO$_2$ layer 28. Layers 26, 27, and 28 are selectively etched in accordance with the areas in which groove 13 is to be formed, and N$^-$ type layer 19 is formed by a diffusion process.

Next, as shown in FIG. 4B, by using SiO$_2$ layer 26, SiN layer 27, and CVD SiO$_2$ layer 28 as a mask, P type well 12 is selectively etched to form groove 13. Subsequently, CVD-SiO$_2$ layer 28 is removed. As a result of the formation of groove 13, memory cell forming region 14 is formed in P type well 12.

Next, as shown in FIG. 4C, after first insulating layer 20 has been formed on the entire inner surface of groove 13 by conventional CVD (Chemical Vapor Deposition) techniques or thermal oxide growth techniques, the entire top surface of the semiconductor structure is coated with a photoresist layer 30, so that groove 13 is filled with the photoresist. Thereafter, the surface of photoresist layer 30 is made flat. As the photoresist, OFPR 800Hs (trade name) can be used.

Next, as shown in FIG. 4D, the entire surface of the semiconductor structure is sequentially coated with an SOG (Spin On Glass) layer 31 and a photoresist layer 32, and then the portions of layers 31 and 32 that located over n$^-$ layer 19 are removed. Subsequently, by using the remaining SOG layer as a mask, a portion of photoresist layer 30 is etched away so that photoresist layer 30 remains in the bottom portion of groove 13 at a desired thickness, as shown in FIG. 4E. In the next step, with the remaining photoresist layer 30 in the bottom portion of groove 13 being used as a mask, first insulating layer 20 on the inner surface of the upper portion of groove 13 is etched away by ammonium fluoride solution so that first insulating layer 20 remains on the inner surface of the lower portion of groove 13. To carry out the selective etching of photoresist layer 30, the RIE (reaction ion etching; pressure 10 Pa, O$_2$ gas atmosphere, power 300 W) technique using O$_2$ as etching gas can be used.

Next, SOG layer 31 is removed, and then photoresist layer 30 is removed by ashing technique using O$_2$ gas. Subsequently, as shown in FIG. 4F, AsSG layer (silicate glass containing As) 34 is deposited onto the entire upper surface of the semiconductor structure. The intermediate semiconductor product as shown in FIG. 4F is next subjected to heat treatment to form an N$^-$ type layer 19 into the inner surface region of the upper portion of groove 13 by diffusion of As contained in AsSG layer 34 thereinto.

After the removal of AsSG layer 34, SiN layer 27, and SiO$_2$ layer 26, an SiO$_2$ layer (second insulating layer) 21 is thermally grown to a thickness of 100 Å as shown in FIG. 4G. Further, a polysilicon layer is deposited over the entire upper surface using the CVD technique, and the deposited polysilicon layer is patterned so that the polysilicon layer remains only in the upper portion of the groove of the capacitor forming region.

After the step shown in FIG. 4G has been completed, gate insulator 17, gate electrode 18, N$^+$ regions 16 and 15 for the source and drain are formed to fabricate the MOS transistor as shown in FIG. 3 in accordance with conventional processes. Subsequently, insulating layer 24, and aluminum wiring 25 adapted for a bit line are formed.

Figure 1:
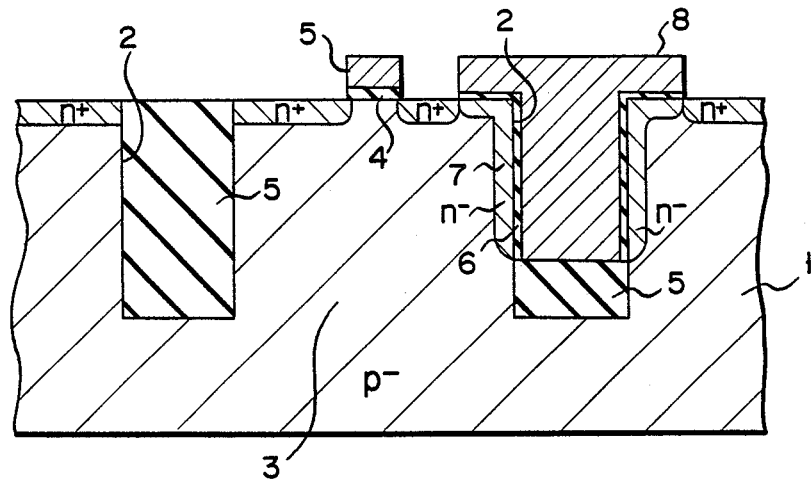
FIG. 1 is a cross sectional view of a prior art folded capacitor cell.

According to the embodiment of FIG. 3, capacitor electrode 22 formed of polysilicon is embedded in groove 13 through thin first and second insulating layers 20 and 21 or first insulating layer 20. Since the coefficients of thermal expansion of polysilicon and substrate or P well 12 approximate to each other, it is possible to prevent crystal defects which would occur in the substrate if there is a difference between the thermal expansion coefficients. Since first insulating layer 20 has a thickness of 500~1,000 Å, which is relatively thick, it is possible to successfully electrically separate memory cell forming region 14. Further, second insulating layer 21 has a thickness of 100 Å, which is sufficiently thin, so that the capacitance of the capacitor increases. Further, unlike the prior art shown in FIG. 1, it is unnecessary to etch the SiO$_2$ layer in the capacitor forming groove, thus preventing broadening of the groove width. Accordingly, the memory cells of DRAM can be integrated in high density, and the reliability of the memory cells can be elevated.

Referring now to FIG. 5 another embodiment of this invention will be described. This embodiment can be realized when groove 13 is formed in P⁻ type substrate 11, not in the P type well.

In the embodiment of FIG. 5, first insulating layer 20 is formed to a thickness of 2,000~3,000 Å. With this embodiment, when first insulating layer is formed to have a thickness of 500 to 1,000 Å, it is only required to decrease a potential difference between the capacitor and the substrate under the condition that substrate 11 is supplied with a potential of 0 V.

In FIG. 3, second insulating layer 21 can be replaced by a three-layer structure of $SiO_2$-$Si_3N_4$-$SiO_2$ to increase the capacitance of the capacitor.

With the embodiment shown in FIGS. 4A to 4G, although SOG layer 31 (FIG. 4D) is used as a mask to etch photoresist 30 using the $O_2$RIE technique, a different type of photoresist may be used instead of SOG layer 31. For example, PMMA (polymethyl methacrylate) resist may be used as resist 30 to be embedded in groove 13, and RD2000N (trade name) may be used instead of SOG layer 31. This RD2000N is exposed to light of a wavelength of 330 nm to which the PMMA resist is not sensitive, and then developed to obtain a patterned mask. By using the patterned mask and the etching selectivity of the $O_2$RIE technique the PMMA resist can be left only in the bottom portion of groove 13 as in FIG. 4E. According to this method resist layer 32 of FIG. 4D is unnecessary.

Alternatively, instead of using the $O_2$RIE technique, by exposing the PMMA resist to light of a wavelength of 220 nm and developing the resist to a desired depth using the patterned mask, the PMMA resist can be left in the bottom portion of groove 13.

In the embodiment of FIGS. 4A to 4G, during the steps of FIGS. 4D and 4E for embedding resist 30 in groove 13 and etching the resist so that a portion thereof remains in the bottom portion of groove 13, $SiO_2$ layer 26 and SiN layer 27 serve as protective layers for the surface of substrate 12. Alternatively, a CVD-$SiO_2$ layer may be deposited over SiN layer 27 to form a composite protective layer of $SiO_2$ (26)-SiN (27)-CVD-$SiO_2$ layer. Further, a polysilicon layer may be provided between $SiO_2$ layer 26 and SiN layer 27 so that a composite protective layer of $SiO_2$-polysilicon-SiN-CVD-$SiO_2$ is formed. Alternatively, SiN or $SiO_2$ layer may be used as a single protective layer.

The composite protective layer of $SiO_2$-SiN-CVD-$SiO_2$ can be formed by depositing sufficiently thick CVD-$SiO_2$ layer 28 (shown in FIG. 4A) over SiN layer 27. The composite protective layer of $SiO_2$-polysilicon-SiN-CVD-$SiO_2$ can be formed in a similar way. For the single protective layer of SiN or $SiO_2$, it is only required that each of layers 26, 27, and 28 of FIG. 4A be grown to a desired thickness.

In the embodiment of FIGS. 4A to 4B, an $SiO_2$ layer is used as first insulating layer 20, which is formed by the thermal oxidation technique, or CVD technique. Or, a composite layer of $SiO_2$-SiN, a composite layer of $SiO_2$-SiN-$SiO_2$, or a composite layer of $SiO_2$-polysilicon (undoped or P as As doped polysilicon) -$SiO_2$ may be used instead.

The polysilicon layer serving as capacitor electrode 22 may be a single layer. Alternatively, a two-layer structure having an $SiO_2$ layer embedded in that portion of polysilicon layer 22 which is represented by dotted lines 35 in FIG. 4G.

With the embodiment of FIGS. 4A to 4G, N-region 19 in the inner surface region of the capacitor forming groove is formed by an operation of impurity diffusion carried out through AsSG layer 34. Alternatively, the N⁻ type region may be formed by an operation of impurity diffusion through PSG or ion implantation. Further, with the embodiments, N⁻ type region 19 facing capacitor electrode 22 is also formed in the peripheral region around the top of groove 13. Alternatively, the N⁻ type region may be formed in the inner surface region of groove 13 only.

What is claimed is:

1. A semiconductor memory device comprising groove means formed in a semiconductor substrate for separating one memory cell-forming region from another, said memory cell comprising a MOS transistor formed in said memory cell-forming region and a capacitor connected in series to said MOS transistor, and said groove means including a first groove in which a first insulating layer for separating said memory cell-forming region and a second insulating layer for forming said capacitor are formed, and a second groove in which said first insulating layer is formed; wherein said first insulating layer in said first groove is formed on the inner surface of a predetermined lower portion of said first groove and has a thickness which is less than half the width of said first groove, said second insulating layer has a thickness which is less than that of said first insulating layer, said second insulating layer in said first groove is provided on the inner surface of the remaining upper portion of said first groove, and a capacitor electrode is made of semiconductor material provided in said first groove along said first and second insulating layers and in said second groove, along said first insulating layer.

2. A semiconductor memory device according to claim 1, wherein said semiconductor substrate is made of silicon and said capacitor electrode is made of polysilicon.

3. A semiconductor memory device comprising groove means formed in a semiconductor substrate of a first conductive type for electrically separating one memory cell-forming region from another, said memory cell comprising a MOS transistor formed in said memory cell-forming region and a capacitor connected in series to said MOS transistor, and said groove means including a capacitor forming groove in which said capacitor is formed, wherein said capacitor forming groove includes a first insulating layer provided on the inner surface of a predetermined lower portion of said capacitor forming groove, and a second insulating layer provided on the inner surface of the remaining upper portion of said capacitor forming groove of a second conductivity type, said first insulating layer has a thickness which is less than half the width of said capacitor forming groove, providing a recess in said lower portion of said capacitor forming groove, and said first insulating layer being thicker than that of said second insulating layer, and a capacitor electrode made of semiconductor material is provided in said capacitor forming groove along said first and second insulating layers.

* * * * *